United States Patent
Retersdorf et al.

(10) Patent No.: US 7,533,313 B1
(45) Date of Patent: May 12, 2009

(54) METHOD AND APPARATUS FOR IDENTIFYING OUTLIER DATA

(75) Inventors: Michael Alan Retersdorf, Austin, TX (US); Michael G. McIntyre, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 443 days.

(21) Appl. No.: 11/371,771

(22) Filed: Mar. 9, 2006

(51) Int. Cl.
*G01R 31/28* (2006.01)

(52) U.S. Cl. .................. 714/724; 714/732; 714/745; 714/37; 702/1; 702/57; 702/81; 702/127; 702/187; 707/101; 707/102

(58) Field of Classification Search .......... None
See application file for complete search history.

(56) References Cited

U.S. PATENT DOCUMENTS

| | | | | |
|---|---|---|---|---|
| 6,330,526 B1 * | 12/2001 | Yasuda | ............ | 703/2 |
| 6,470,229 B1 * | 10/2002 | Wang et al. | ............ | 700/121 |
| 6,792,373 B2 * | 9/2004 | Tabor | ............ | 702/108 |
| 6,799,136 B2 * | 9/2004 | Patel et al. | ............ | 702/127 |
| 6,828,165 B2 * | 12/2004 | Tanaka et al. | ............ | 438/14 |
| 7,194,369 B2 * | 3/2007 | Lundstedt et al. | ............ | 702/104 |
| 7,225,107 B2 * | 5/2007 | Buxton et al. | ............ | 702/183 |
| 7,356,430 B2 * | 4/2008 | Miguelanez et al. | ............ | 702/108 |
| 2002/0133772 A1 * | 9/2002 | Voorakaranam et al. | ............ | 714/732 |
| 2003/0014205 A1 * | 1/2003 | Tabor | ............ | 702/84 |
| 2003/0199108 A1 * | 10/2003 | Tanaka et al. | ............ | 438/14 |
| 2004/0264807 A1 * | 12/2004 | Yakhini et al. | ............ | 382/289 |
| 2004/0267477 A1 * | 12/2004 | Scott et al. | ............ | 702/108 |
| 2006/0095237 A1 * | 5/2006 | Wang et al. | ............ | 703/2 |
| 2007/0143037 A1 * | 6/2007 | Lundstedt et al. | ............ | 702/30 |
| 2008/0021677 A1 * | 1/2008 | Buxton et al. | ............ | 702/184 |

* cited by examiner

*Primary Examiner*—John P Trimmings
(74) *Attorney, Agent, or Firm*—Williams, Morgan & Amerson, P.C.

(57) ABSTRACT

A method for converting data includes generating a first data vector of data measurements related to processing of at least one workpiece. Each element of the first data vector is associated with at least one of a plurality of positions on the workpiece. A cumulative distribution of the elements in the first data vector is generated. An outlier region of the data measurements is identified based on the cumulative distribution. A binary outlier data vector is generated from the first data vector by assigning a first binary value to the data elements in the first data vector in the outlier region and assigning a second binary value to the remaining data elements in the first data vector.

24 Claims, 5 Drawing Sheets

METHOD AND APPARATUS FOR IDENTIFYING OUTLIER DATA

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to data processing and, more particularly, to a method and apparatus for identifying outlier data.

Technology advancements in the manufacturing industry have resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (e.g., patterning, etching, doping, ion implanting, etc.), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using a patterned layer of photoresist as a mask. This etching process results in the formation of various features or objects in the process layer. Such features may be used as, for example, a gate electrode structure for a transistor, a conductive line, or an isolation structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a specific manufacturing process.

FIG. 1 illustrates a wafer map of a typical semiconductor wafer 100. The semiconductor wafer 100 typically includes a plurality of individual semiconductor die 110 arranged in a grid 120. Typically, various data is collected during or after the fabrication of the wafer 100 and/or die 110. This data may include performance data, such as the yield of the wafer 100 (i.e., which die 110 are functional), the speed of each die 110, the power consumption of each die 110, etc. This data may also include metrology data relating the fabrication of the wafer, such as process layer thickness, critical dimensions, etc. Hence, the data may be binary (e.g., yield) or continuous (e.g., speed). Binary data may become continuous when the results for multiple wafers are combined. For example, the yield of die 110 in a certain position within the grid 120 may be represented as a percentage.

Data collected during the fabrication of the wafer 100 may be shown on a wafer map that imposes the data over the structure of the wafer 100, as shown by the yield data presented on the wafer map in FIG. 1. Only a subset of the exemplary yield percentages is shown to avoid cluttering the wafer map. A wafer map may be directed at a particular wafer, or may combine data for multiple wafers, commonly referred to as a stacked wafer map. Although the data in FIG. 1 is illustrated as being shown using a number, it is also common to use color shadings to reflect the underlying data. For example, die locations with high yields may be shown in shades of green, while die locations with decreasing yields may be shown in shades of yellow or red.

During or after processing of a wafer, the manufacturing system may acquire various metrology or performance data, such as described above. Based on the accumulated data, a statistical analysis may be performed. This process may include analyzing various characteristics (e.g., metrology information, speed grades, etc.) relating to the quality of the processed die. The statistical analysis provides for a continuous data stream that provides indications of the characteristics of various portions of a plurality of wafers. As indicated above, even binary-type data, (e.g., whether a particular wafer region passes a test or not), may become an analog-style continuous signal when analyzing data relating to several wafers. Accordingly, state-of-the-art systems provide analog, continuous data relating the characteristics of the die 110 of various wafers at various positions.

Analyzing this continuous data relating to a plurality of wafers to identify a problem region across several wafers is difficult. Existing pattern recognition approaches typically analyze binary patterns, such as wafer maps of yield on a single wafer to identify and classify faults. For example, the pattern recognition unit differentiates between random defect distributions and localized defects, such as a handling scratch. These pattern recognition techniques do not work well with continuous data. State-of-the-art standard deviation analysis typically does not provide efficient multi-wafer data analysis since each analysis of a portion of several wafers provides many different results that are difficult to quantify as a single data representation. Therefore, analysis of multiple wafer data sets for identifying a common problem area across several wafers may be inefficient and cumbersome.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method for converting data. The method includes generating a first data vector of data measurements related to processing of at least one workpiece. Each element of the first data vector is associated with at least one of a plurality of positions on the workpiece. A cumulative distribution of the elements in the first data vector is generated. An outlier region of the data measurements is identified based on the cumulative distribution. A binary outlier data vector is generated from the first data vector by assigning a first binary value to the data elements in the first data vector in the outlier region and assigning a second binary value to the remaining data elements in the first data vector.

Another aspect of the present invention is seen a system including a process flow, a measurement tool, and a data conversion unit. The process flow is operable to process a plurality of workpieces. The measurement tool operable to acquire data related to the processing of the workpieces. The data conversion unit is operable to generate a first data vector of the data. Each element of the first data vector is associated with at least one of a plurality of positions associated with the workpieces. The data conversion unit is operable to generate a cumulative distribution of the elements in the first data vector, identify an outlier region of the data measurements based on the cumulative distribution, and generate a binary outlier data vector from the first data vector by assigning a first binary value to the data elements in the first data vector in the outlier region and assigning a second binary value to the remaining data elements in the first data vector.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
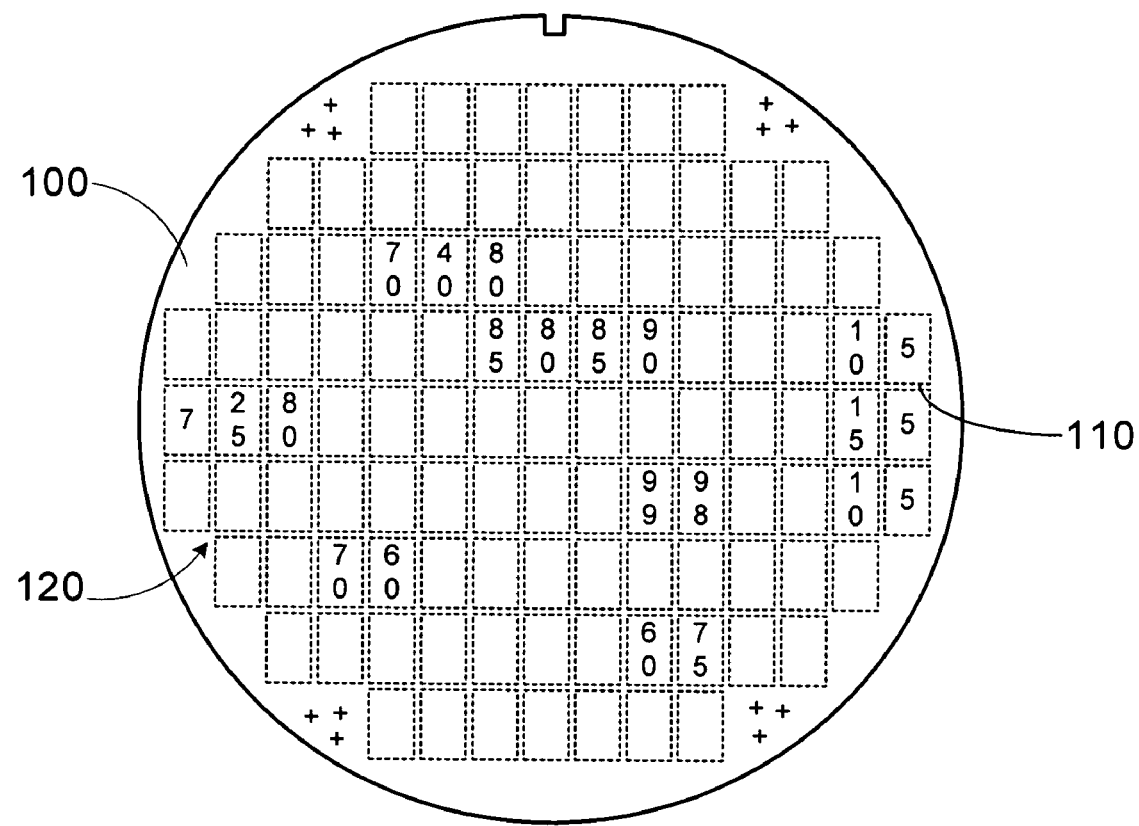
FIG. 1 is a diagram of an illustrative wafer map.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or CDROM), and may be read only or random access. Similarly, the transmission medium may be twisted wire pairs, coaxial cable, optical fiber, wireless or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
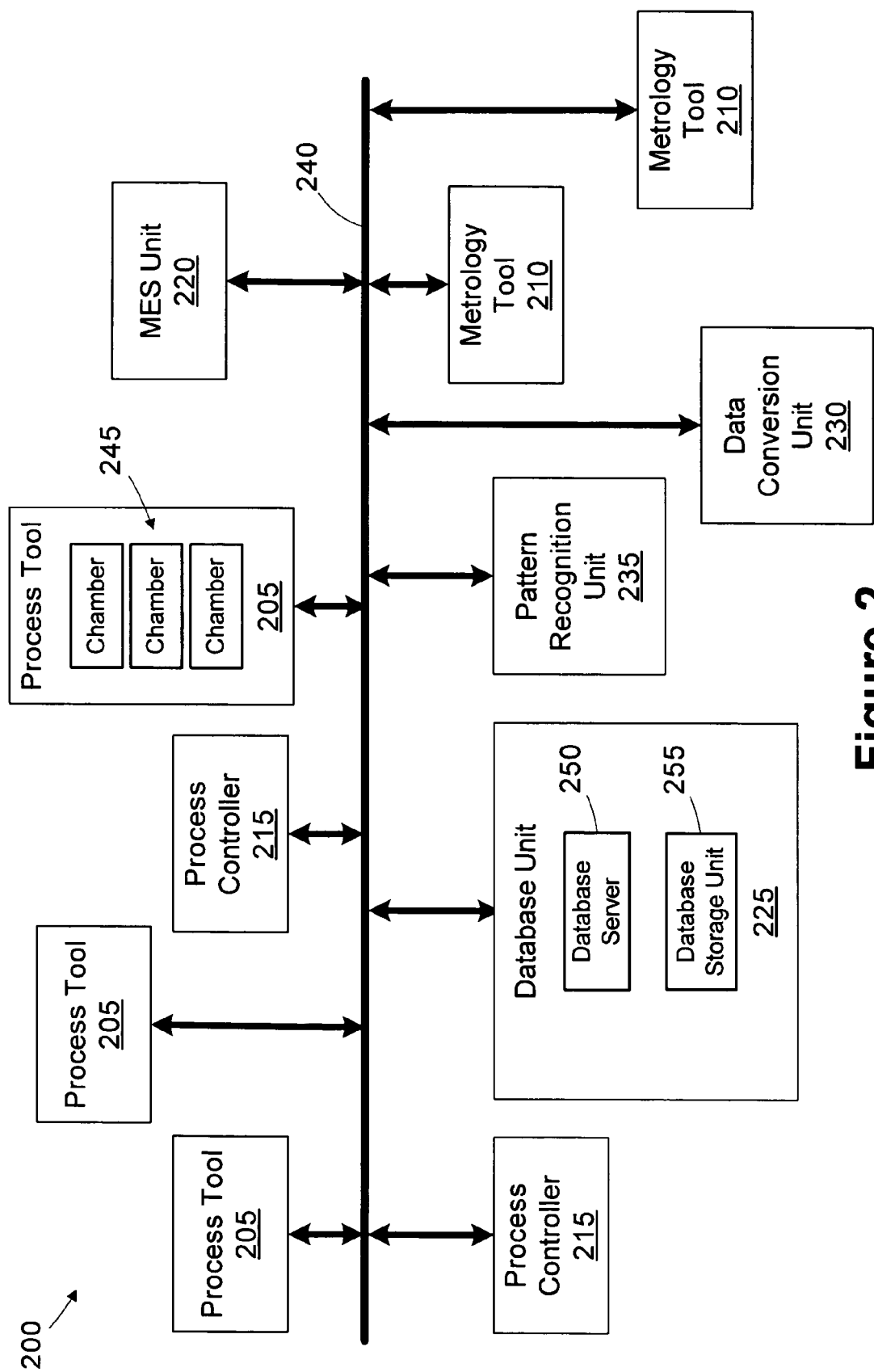
FIG. 2 is a simplified block diagram of a manufacturing system in accordance with one illustrative embodiment of the present invention.

Referring now to the drawings wherein like reference numbers correspond to similar components throughout the several views and, specifically, referring to FIG. 2, the present invention shall be described in the context of an illustrative manufacturing system 200. The manufacturing system 200 includes process tools 205, metrology tools 210, process controllers 215, a manufacturing execution system (MES) unit 220, a database unit 225, a data conversion unit 230, a pattern recognition unit 235, and a network 240. The various entities in the manufacturing system 200 may be implemented using software components, hardware components, firmware components, and/or a combination thereof.

In the illustrated embodiment, the manufacturing system 200 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other devices. The techniques may also be applied to workpieces or manufactured items other than semiconductor devices. Generally, the techniques may be applied to any type of measured data to allow conversion of continuous data into a binary format.

The network 240 interconnects various components of the manufacturing system 200, allowing them to exchange information. Each of the tools 205, 210 may be coupled to a computer (not shown) for interfacing with the network 240, or a suitable interface may be integrated into the tool 205, 210.

A particular wafer or lot of wafers progresses through the process tools 205 as it is being manufactured, with each tool 205 performing a specific function in the process flow. Some of the process tools 205 may include a plurality of chambers 245, each of which may process wafers and may be controlled collectively or individually. Exemplary process tools 205 for a semiconductor device fabrication environment include photolithography steppers, etch tools, deposition tools, polishing tools, rapid thermal processing tools, implantation tools, etc. An actual implementation of the manufacturing system 200 includes many more process tools 205 than those illustrated in FIG. 2, and typically multiple tools of each type are present.

Exemplary metrology tools 210 include film measurement devices, scanning electron microscopes, optical review tools, electrical test tools, etc. Again, an actual implementation includes many metrology tools 210. The metrology tools 210 may measure various parameters associated with the processing of the wafers in the manufacturing system 200, including physical data regarding the processed wafers, such as feature dimensions, process layer thickness, surface profile, etc., or performance data, such as speed, yield, power consumption, etc.

The process controllers 215 determine control actions to control various operations of selected process tools 205 based, at least in part, on metrology data collected by the metrology tools 210 during the fabrication of wafers. The particular control models used by the process controllers 215 depend on the type of process tool 205 being controlled, and the particular metrology data collected for use in conjunction with the control models depends on the feature being formed by the particular process tool 205. The control models may be developed empirically using commonly known linear or non-linear techniques. The control models may be relatively simple equation-based models (e.g., linear, exponential, weighted average, etc.) or more complex models, such as a neural network model, a principal component analysis (PCA) model, or a partial least squares projection to latent structures (PLS) model. The specific implementation of the control models may vary depending on the modeling techniques selected and the process being controlled. The selection and development of the particular control models is within the ability of one of ordinary skill in the art, and accordingly, the control models are not described in greater detail herein for clarity and to avoid obscuring the instant invention.

An exemplary process control scenario involves the control of a gate electrode critical dimension (CD) in a transistor structure. Various processes and process variables may be controlled to affect the gate electrode CD. For example, a photoresist mask is used in a photolithography tool to pattern the gate electrode. The photolithography processes used to form the mask may affect the dimensions of the pattern and thus the dimensions of the gate electrode formed by an etch process using the mask. Exposure time and energy may be controlled to affect the dimensions of the mask. The parameters (e.g., etch time, plasma power, etch gas makeup and concentration, etc.) of the etch process may also affect the CD of the completed gate electrode and may be controlled by a process controller 215. The processes and variables described above that affect the gate electrode CD are not exhaustive. Other processes may be performed that have an impact of the CD and other variables of those processes may be controlled.

The MES unit 220 directs the high level operation of the manufacturing system 200. The MES unit 220 monitors the status of the various entities in the manufacturing system 200 (i.e., lots, tools 205, 210). The database unit 225 is provided for storing a plurality of types of data, such as manufacturing-related data (e.g., pre-process and post process metrology data), data related to the operation of the system 200 (e.g., the status of the tools 205, 210 the status and priorities of semi-conductor wafers 105, etc.). The database unit 225 may store tool state data relating to a plurality of process runs performed by the process tools 205. The database unit 225 may include a database server 250 for storing tool state data and/or other manufacturing data related to processing of wafers into a database storage unit 255.

The MES unit 220 stores information in the database unit 225 related to the particular tools 205, 210 (i.e., or sensors (not shown) associated with the tools 205, 210) used to process each lot of wafers. Sensor data stored for the process tools 205 may include chamber pressure, chamber temperature, anneal time, implant dose, implant energy, plasma energy, processing time, etc. Data associated with the operating recipe settings used by the process tool 205 during the fabrication process may also be stored in the database unit 225. For example, it may not be possible to measure direct values for some process parameters. These settings may be determined from the operating recipe in lieu of actual process data from the process tool 205.

The system 200 is thus capable of acquiring continuous value data, such as metrology or performance data, related to processed semiconductor wafers. The nature of the continuous data may vary, as there are many discrete processes that are involved in semiconductor manufacturing. Many times, workpieces (e.g., semiconductor wafers 105, semiconductor devices, etc.) are stepped through multiple process tools 205. Data relating to various semiconductor wafers 105 may be collected and organized in a fashion such that continuous data relating to one or more regions of several wafers may be analyzed. The data conversion unit 230 implements an outlier recognition technique, described in greater detail below, to convert the continuous data to binary data, suitable for processing by the pattern recognition unit 235. The conversion of the continuous data into a binary format using an outlier identification technique allows subsequent processing of the data for pattern recognition purposes, statistical analysis purposes, etc. Using such a binary representation, patterns relating to the regions may be efficiently recognized.

The continuous value data may relate to any number of measurable characteristics, such as yield results, speed results, performance results, metrology data (e.g., film thickness, line-width, etc.), defect data, parametric data, and/or various other manufacturing measurements.

Figure 3:
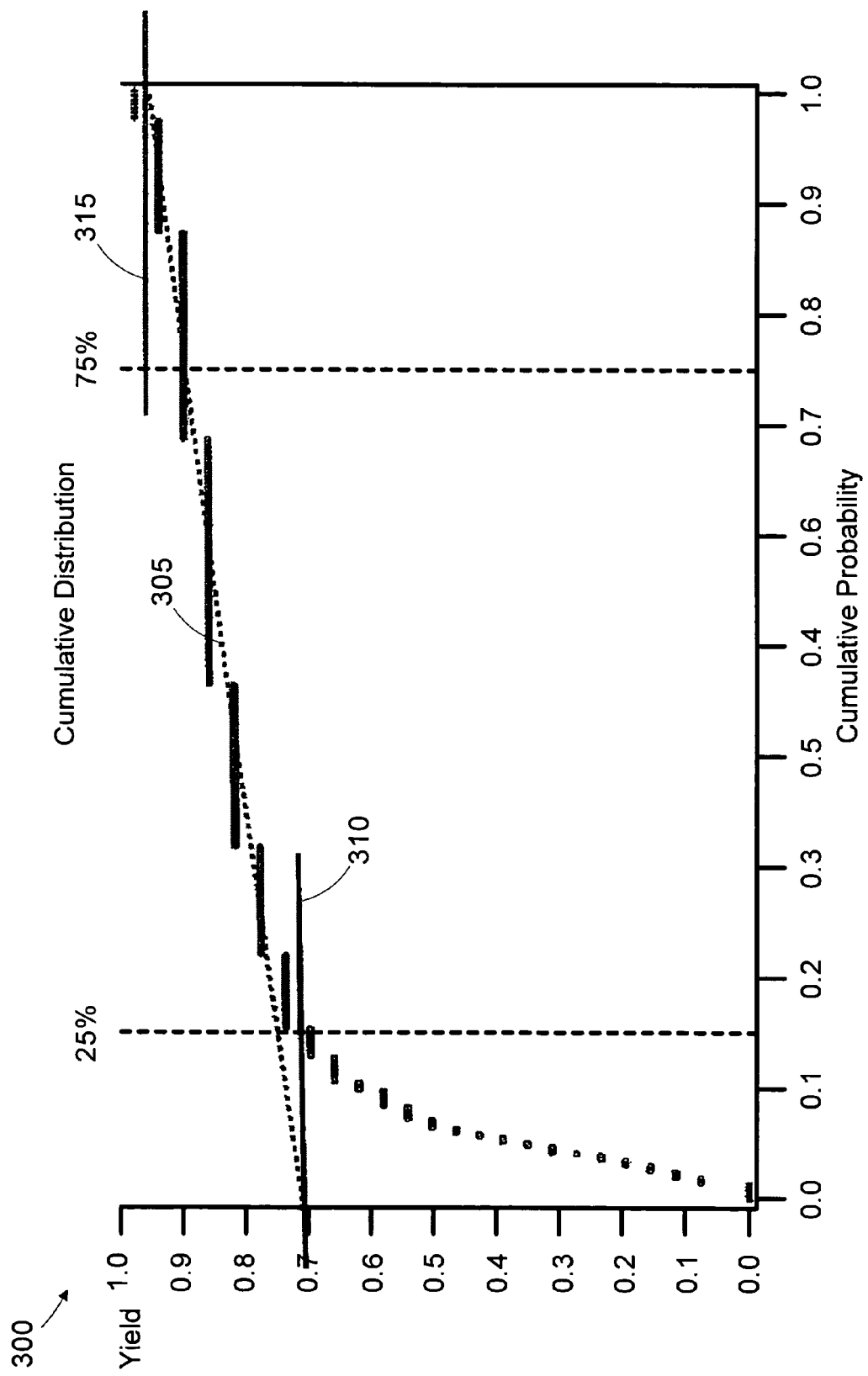
FIG. 3 is a diagram of a cumulative distribution plot.

Turning now to FIG. 3, a diagram illustrating a cumulative distribution plot 300 generated by the data conversion unit 230 is provided. In the example of FIG. 3, the parameter of interest in the cumulative distribution 300 is the yield data generated by a stacked wafer map of a plurality of wafers (e.g., a lot). Of course, the same techniques may be applied to other parameters of interest. Although wafer maps are often displayed in graphical form for ease of human interpretation, such as with the map of FIG. 1, the wafer map may be expressed in non-graphical form as a data vector. Each data vector element represents a position on the wafer, and the values represent the yield at the associated position. Hence, the wafer map is simply a graphical representation of the data vector.

Each data point on the cumulative distribution plot 300 represents the yield of a particular die location across the set of wafers. Hence, the values vary between 0 and 100 percent, or 0.0 to 1.0. The yield associated with each position is shown along the Y-axis. The X-axis represents the percentage of wafers that have a yield of less than or equal to the yield shown on the Y-axis.

To identify outliers, the data conversion unit 230 performs a regression analysis on the portion of the cumulative distribution plot 300 between the $25^{th}$ and $75^{th}$ percentiles of the distribution. This particular range is illustrative, and may vary in an actual implementation depending on the particular nature of the continuous data being analyzed. Hence, generically, the data conversion unit 230 performs a regression on a subset of the data making up the cumulative distribution plot 300. The regression analysis yields a regression line 305 characterizing the data in the selected subset. The yield values at which the regression line 305 intercepts the 0 (i.e., X=0) and 100 (i.e., X=1.0) percentile values are determined, yielding a lower intercept 310 and an upper intercept 315. In cases where the regression line would intercept the 0 and 100 percentile points outside the normal limits values (i.e., less than 0% yield or greater than 100% yield) the intercepts 310, 315 are capped at the normal limit (i.e., 0% or 100%). Although the intercepts 310, 315 are described as they may be determine graphically, the data conversion unit 230 may simply determine an equation for the regression line 305 and solve the equation for the lower intercept 310 or upper intercept 315.

Figure 4:
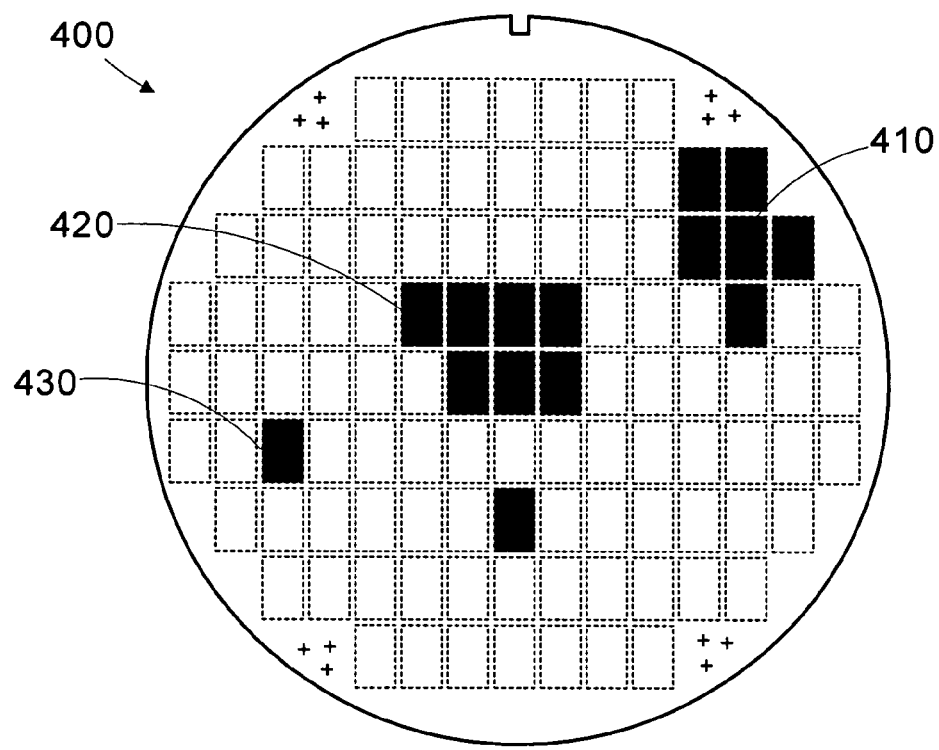
FIGS. 4 and 5 are wafer maps illustrating identified outlier regions.
Figure 5:
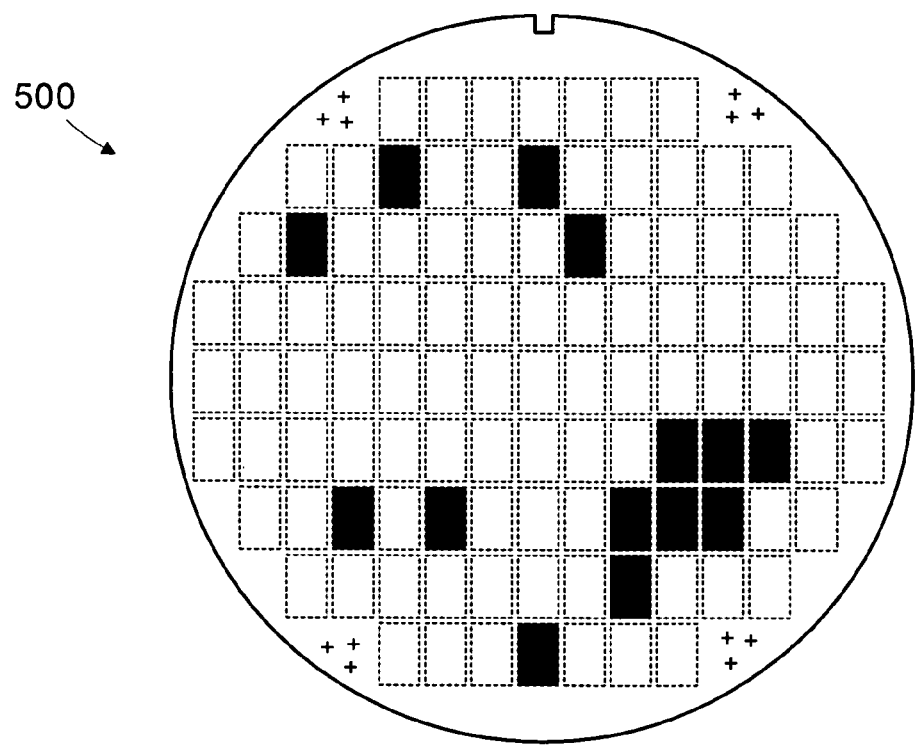

The data conversion unit 230 identified outliers as those data points (i.e., yields) lying below the lower intercept 310 or above the upper intercept 315. The data conversion unit 230 may perform outlier identification using the lower intercept 310, the upper intercept 315, or both, depending on the particular parameter being plotted. For example, locations with low yield may be identified using the lower intercept 310, and locations with high yield may be identified using the upper intercept 315. Separate wafer maps may be generated to isolate the lower outliers and upper outliers, as shown in FIGS. 4 and 5 which illustrate a low yield wafer map 400 and a high yield wafer map 500, respectively. Again, the wafer maps 400, 500 may not be in graphical form, but rather they may be expressed as data vectors.

The data in FIGS. 4 and 5 is thus represented in binary form, with the unshaded die locations representing locations with parameter values within expected limits, and the shaded die locations representing outliers. Hence, the data conversion unit 230 converts the continuous data vector into one or more binary outlier data vectors that may be communicated to the pattern recognition unit 235 for analysis.

The pattern recognition unit 235 may comprise a controller and/or other circuitry, such as registers, memory devices, etc., to evaluate the binary mapping of various common regions across a plurality of wafers based on the outlier data vector(s) generated by the data conversion unit 230. For example, common regions associated with a plurality of wafers represented in stacked wafer map may be identified using a binary pattern recognition technique. The pattern recognition results may be indicative of the performance of the processes that produce the results associated with the various regions. Generally, the pattern recognition unit 235 maintains a library of reference patterns that have various associated characteristics. For example, a yield pattern recognition library may include reference patterns associated with handling scratches, unlevel chucks, plasma control problems, etc. In the context of FIG. 4, the region 410 may represent a region with a handling scratch that caused failures in the associated die locations. The region 420 may represent a defect induced by a non-uniform plasma condition during the processing of the wafers that caused a defect in the central region of the wafer. The non-grouped faults, such as that for die location 430, may represent randomly distributed faults. The specific pattern recognition techniques employed by the pattern recognition unit 235 are not material to the practice of the present invention, and will vary depending on the parameter being analyzed. Any pattern recognition system known to those skilled in the art having benefited the present disclosure may be utilized to analyze the patterns to perform further analysis. This analysis then may be used to perform control adjustments to various processes in the manufacturing system 200.

Based upon this pattern recognition process, various statistical analyses or other analysis may be performed to provide for adjustment(s) to the operation of the process tools 205. Additionally, further calibration or adjustments to the metrology tools 210 may be performed as a result of the pattern recognition provided by the pattern recognition unit 235. The process controllers 215 may perform feedback and/or feed-forward adjustments based upon the pattern recognition data.

Utilizing embodiments of the present invention, a plurality of continuous value data relating to various regions on a wafer map may be efficiently analyzed. Continuous distributions of continuous value data may be then converted into a digital/binary type format for efficient pattern recognition of regions on a wafer map. Therefore, efficient deciphering of process results relating to particular regions of a wafer map may be performed. This allows for effective control adjustments to improve process results of die portions associated with various regions across a plurality of semiconductor wafers.

In the context of FIG. 2, the pattern recognition data may be reported back to the process controllers 215 or to a passive data storage location in the database unit 225, along with the context of the rules used to generate the wafer map 400, 500. Therefore, efficient analysis of various signals relating to the binary patterns of the regions may be performed.

The principles taught by the present invention can be implemented in an Advanced Process Control (APC) Framework. The APC framework is a platform from which to implement the control strategy taught by the present invention. In some embodiments, the APC framework can be a factory-wide software system; therefore, the control strategies taught by the present invention can be applied to virtually any of the semiconductor tools on the factory floor. The APC framework also allows for remote access and monitoring of the process performance. Furthermore, by utilizing the APC framework, data storage can be more convenient, more flexible, and less expensive than the use of local controllers and storage drives. The APC framework allows for sophisticated types of control, because it provides a significant amount of flexibility in writing the necessary software code.

Deployment of the control strategy taught by the present invention onto the APC framework could require a number of software components. In addition to components within the APC framework, a computer script may be written for one or more of the tools in the manufacturing system 200. When a semiconductor manufacturing process tool 205 is started, it generally calls upon a script to initiate the action that is required by the process controller, such as an overlay controller. The control methods are generally defined and performed in these scripts. The development of these scripts can comprise a significant portion of the development of a control system. The principles taught by the present invention can also be implemented into other types of manufacturing frameworks.

Although the invention is described as it may be implemented in a semiconductor environment, where the continuous data represents data collected for various die locations, the technique may be applied to other environments where other types of continuous data is collected across multiple locations of a workpiece. For example, the positions may represent locations within a memory array or across a display panel. Generally, the method may be applied to any number of applications where data associated with various positions on a workpiece is converted to digital data to allow pattern recognition. Also, the technique may be applied to data, such as census data, associated with various locations.

Figure 6:
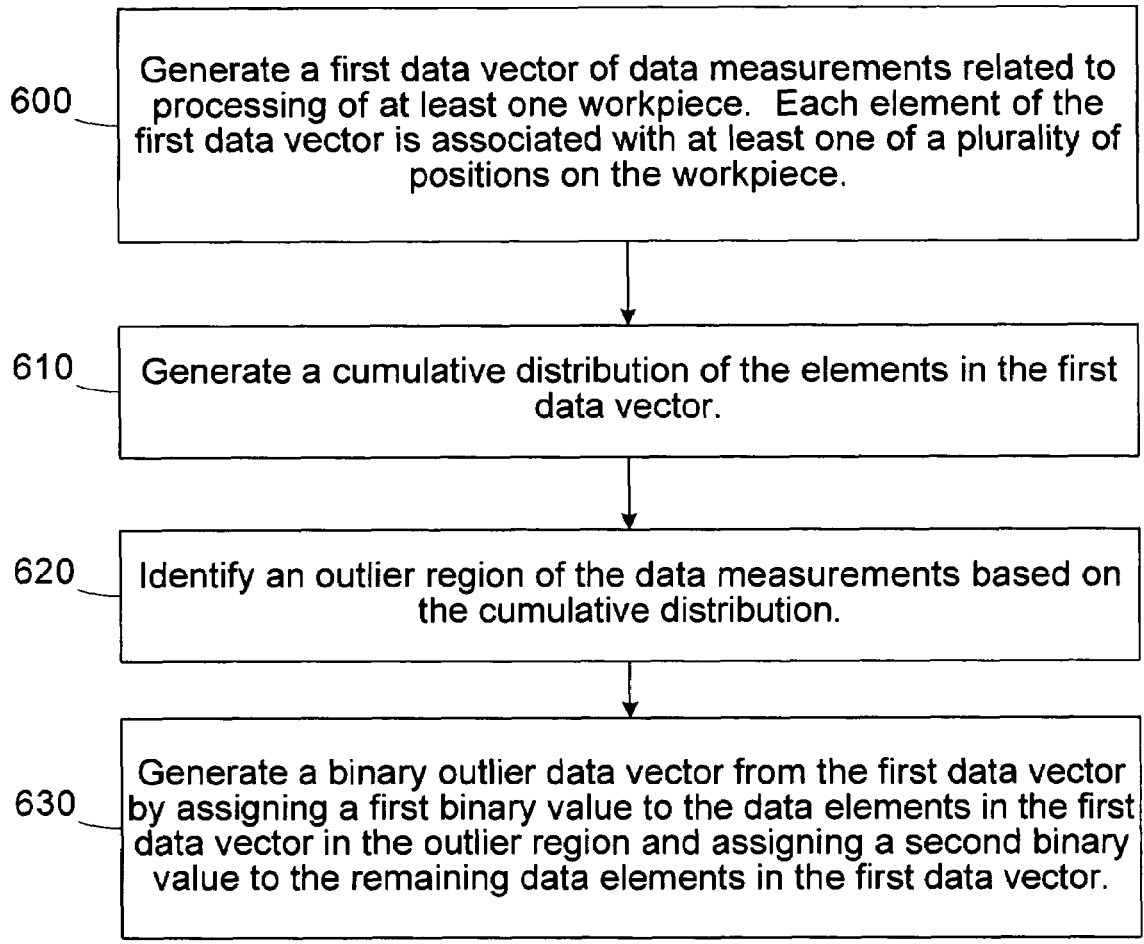
FIG. 6 is a simplified flow diagram of a method for converting data in accordance with another illustrative embodiment of the present invention.

Referring to FIG. 6, a simplified flow diagram of a method for converting data in accordance with another illustrative embodiment of the present invention is shown. In block 600, a first data vector of data measurements related to processing of at least one workpiece is generated. Each element of the first data vector is associated with at least one of a plurality of positions on the workpiece. A cumulative distribution of the elements in the first data vector is generated in block 610. In block 620, an outlier region of the data measurements is identified based on the cumulative distribution. In block 630, a binary outlier data vector is generated from the first data vector by assigning a first binary value to the data elements in the first data vector in the outlier region and assigning a second binary value to the remaining data elements in the first data vector.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method for converting data, comprising:
generating a first data vector of data measurements related to processing of at least one workpiece, each element of the first data vector being associated with at least one of a plurality of positions on the workpiece;
generating a cumulative distribution of the elements in the first data vector;
identifying an outlier region of the data measurements based on the cumulative distribution by:
performing a regression analysis using elements of the first data vector falling within a first predetermined range on the cumulative distribution to generate a regression line;
determining an intercept value where the regression line intercepts a predetermined threshold; and
identifying the outlier region based on the intercept value; and
generating a binary outlier data vector from the first data vector by assigning a first binary value to the data elements in the first data vector in the outlier region and assigning a second binary value to the remaining data elements in the first data vector.

2. The method of claim 1, wherein generating the first data vector comprises collecting the data measurements related to processing of a plurality of workpieces and combining the data measurements for each workpiece at each position.

3. The method of claim 2, wherein the plurality of workpieces comprises a plurality of semiconductor wafers, and the plurality of positions comprises a plurality of die locations.

4. The method of claim 3, further comprising generating a wafer map based on the binary outlier data vector.

5. The method of claim 2, further comprising performing a pattern recognition analysis based on the outlier data vector.

6. The method of claim 5, further comprising adjusting the processing of the workpieces based on the pattern recognition analysis.

7. The method of claim 6, further comprising processing additional workpieces subsequent to the adjusting.

8. The method of claim 1, wherein the predetermined threshold comprises a lower threshold, and identifying the outlier region further comprises identifying data elements on the cumulative distribution having values below the intercept value.

9. The method of claim 8, wherein the lower threshold comprises a 0 percentile value on the cumulative distribution.

10. The method of claim 1, wherein the predetermined threshold comprises an upper threshold, and identifying the outlier region further comprises identifying data elements on the cumulative distribution having values above the intercept value.

11. The method of claim 10, wherein the upper threshold comprises a 100 percentile value on the cumulative distribution.

12. The method of claim 1, wherein the workpieces comprise semiconductor devices, and the data measurements comprise at least one of yield data, speed data, performance data, and metrology data.

13. The method of claim 1, wherein the workpieces comprise semiconductor devices, and the data measurements are associated with at least one of a process layer thickness, a photolithography process parameter, an etch result parameter, a chemical-mechanical polishing result parameter, a deposition process result parameter, and an ion implant process result parameter.

14. A method, comprising:
acquiring data related to the processing of a plurality of workpieces;
generating a first data vector of the data, each element of the first data vector being associated with at least one of a plurality of positions associated with the workpieces;
generating a cumulative distribution of the elements in the first data vector;
identifying an outlier region of the data measurements based on the cumulative distribution by:
performing a regression analysis using elements of the first data vector falling within a first predetermined range on the cumulative distribution to generate a regression line;
determining an intercept value where the regression line intercepts a predetermined threshold; and
identifying the outlier region based on the intercept value; and
generating a binary outlier data vector from the first data vector by assigning a first binary value to the data elements in the first data vector in the outlier region and assigning a second binary value to the remaining data elements in the first data vector.

15. The method of claim 14, further comprising performing a pattern recognition analysis based on the outlier data vector.

16. The method of claim 15, further comprising adjusting the processing of the workpieces based on the pattern recognition analysis.

17. The method of claim 16, further comprising processing additional workpieces subsequent to the adjusting.

18. A system, comprising:
a process flow operable to process a plurality of workpieces;
a measurement tool operable to acquire data related to the processing of the workpieces;
a data conversion unit operable to generate a first data vector of the data, each element of the first data vector being associated with at least one of a plurality of positions associated with the workpieces, generate a cumulative distribution of the elements in the first data vector, identify an outlier region of the data measurements based on the cumulative distribution by performing a regression analysis using elements of the first data vector falling within a first predetermined range on the cumulative distribution to generate a regression line, determining an intercept value where the regression line intercepts a predetermined threshold, and identifying the outlier region based on the intercept value, and generate a binary outlier data vector from the first data vector by assigning a first binary value to the data elements in the first data vector in the outlier region and assigning a second binary value to the remaining data elements in the first data vector.

19. A system, comprising:
means for generating a first data vector of data measurements related to processing of at least one workpiece, each element of the first data vector being associated with at least one of a plurality of positions on the workpiece;
means for generating a cumulative distribution of the elements in the first data vector;
means for identifying an outlier region of the data measurements based on the cumulative distribution by performing a regression analysis using elements of the first data vector falling within a first predetermined range on the cumulative distribution to generate a regression line, determining an intercept value where the regression line intercepts a predetermined threshold, and identifying the outlier region based on the intercept value; and
means for generating a binary outlier data vector from the first data vector by assigning a first binary value to the data elements in the first data vector in the outlier region and assigning a second binary value to the remaining data elements in the first data vector.

20. A computer-implemented method for identifying outlier data, comprising:
generating a first data vector of data;
generating a cumulative distribution of the elements in the first data vector;
identifying an outlier region of the data based on the cumulative distribution by performing a regression analysis using elements of the first data vector falling within a first predetermined range on the cumulative distribution to generate a regression line, determining an intercept value where the regression line intercepts a predetermined threshold, and identifying the outlier region based on the intercept value; and
designating data elements in the first data vector in the outlier region as outlier data elements.

21. The method of claim 20, wherein the predetermined threshold comprises a lower threshold, and identifying the outlier region further comprises identifying data elements on the cumulative distribution having values below the intercept value.

22. The method of claim 21, wherein the lower threshold comprises a 0 percentile value on the cumulative distribution.

23. The method of claim 20, wherein the predetermined threshold comprises an upper threshold, and identifying the outlier region further comprises identifying data elements on the cumulative distribution having values above the intercept value.

24. The method of claim 23, wherein the upper threshold comprises a 100 percentile value on the cumulative distribution.

* * * * *